United States Patent [19]

Wolaver

[11] Patent Number: 4,590,602
[45] Date of Patent: May 20, 1986

[54] WIDE RANGE CLOCK RECOVERY CIRCUIT

[75] Inventor: Dan H. Wolaver, Worcester, Mass.

[73] Assignee: General Signal, Stamford, Conn.

[21] Appl. No.: 524,325

[22] Filed: Aug. 18, 1983

[51] Int. Cl.$^4$ .................................................. H03D 3/24
[52] U.S. Cl. ........................................ 375/120; 375/82; 331/1 A
[58] Field of Search ................ 375/97, 106, 110, 120, 375/81, 82; 307/527; 328/63, 72, 74, 155; 331/1 A, 4, 1 R; 455/260, 180

[56] References Cited

U.S. PATENT DOCUMENTS

| | | | |
|---|---|---|---|
| 3,859,631 | 1/1975 | Holmes et al. | 375/97 |
| 3,936,762 | 2/1976 | Cox et al. | 329/104 |
| 3,959,601 | 5/1976 | Olevsky et al. | 375/120 |
| 3,980,951 | 9/1976 | Breeze et al. | 455/180 |
| 4,015,083 | 3/1977 | Bellisio | 375/120 |
| 4,077,016 | 2/1978 | Sanders et al. | 375/120 |
| 4,079,329 | 3/1978 | England et al. | 375/120 |
| 4,088,959 | 5/1978 | Sumi | 455/180 |
| 4,105,946 | 8/1978 | Ikeda | 331/1 A |
| 4,121,162 | 10/1978 | Alberkrack et al. | 331/1 A |
| 4,135,165 | 1/1979 | Coe | 331/1 A |
| 4,186,347 | 1/1980 | Brockman et al. | 375/97 |
| 4,206,425 | 6/1980 | Nossen | 332/19 |
| 4,280,104 | 7/1981 | Rzeszewski | 331/1.1 |
| 4,321,555 | 3/1982 | Howk et al. | 331/1 A |
| 4,344,045 | 8/1982 | Das et al. | 331/1 A |
| 4,375,693 | 3/1983 | Kuhn | 375/120 |
| 4,375,694 | 3/1983 | Kuhn | 375/120 |
| 4,380,815 | 4/1983 | Clendening | 375/81 |
| 4,388,596 | 6/1983 | Yamashita | 331/1 A |
| 4,451,930 | 5/1984 | Chapman et al. | 375/97 |

Primary Examiner—Robert L. Griffin
Assistant Examiner—Stephen Chin
Attorney, Agent, or Firm—Barnes & Thornburg

[57] ABSTRACT

A wide range, variable rate clock recovery circuit for NRZ data is provided having a PLL and a frequency synthesizer which share control of a common VCO in single loop realization. Narrow PLL bandwidths and short acquisition time may be achieved employing the frequency synthesizer to initially control the VCO to produce an estimate of the data frequency which is accurate to within the bandwidth of the PLL. Once this VCO frequency is attained, the PLL disables the frequency synthesizer control of the VCO and provides fine tuning control of the VCO output frequency itself. Single loop realization is achieved with a wide range VCO which includes a narrow range VCO, a frequency divider, and an auto-ranging circuit.

12 Claims, 5 Drawing Figures

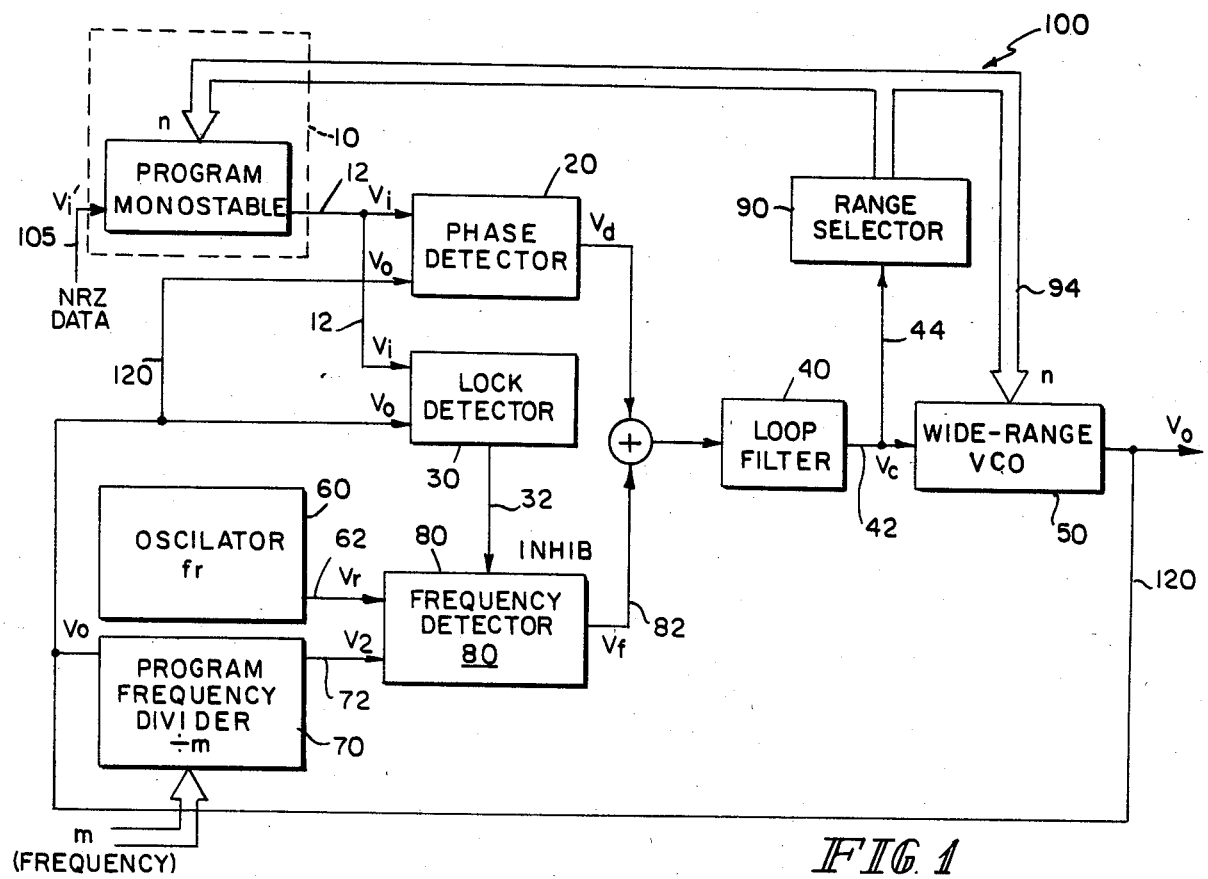
FIG. 1
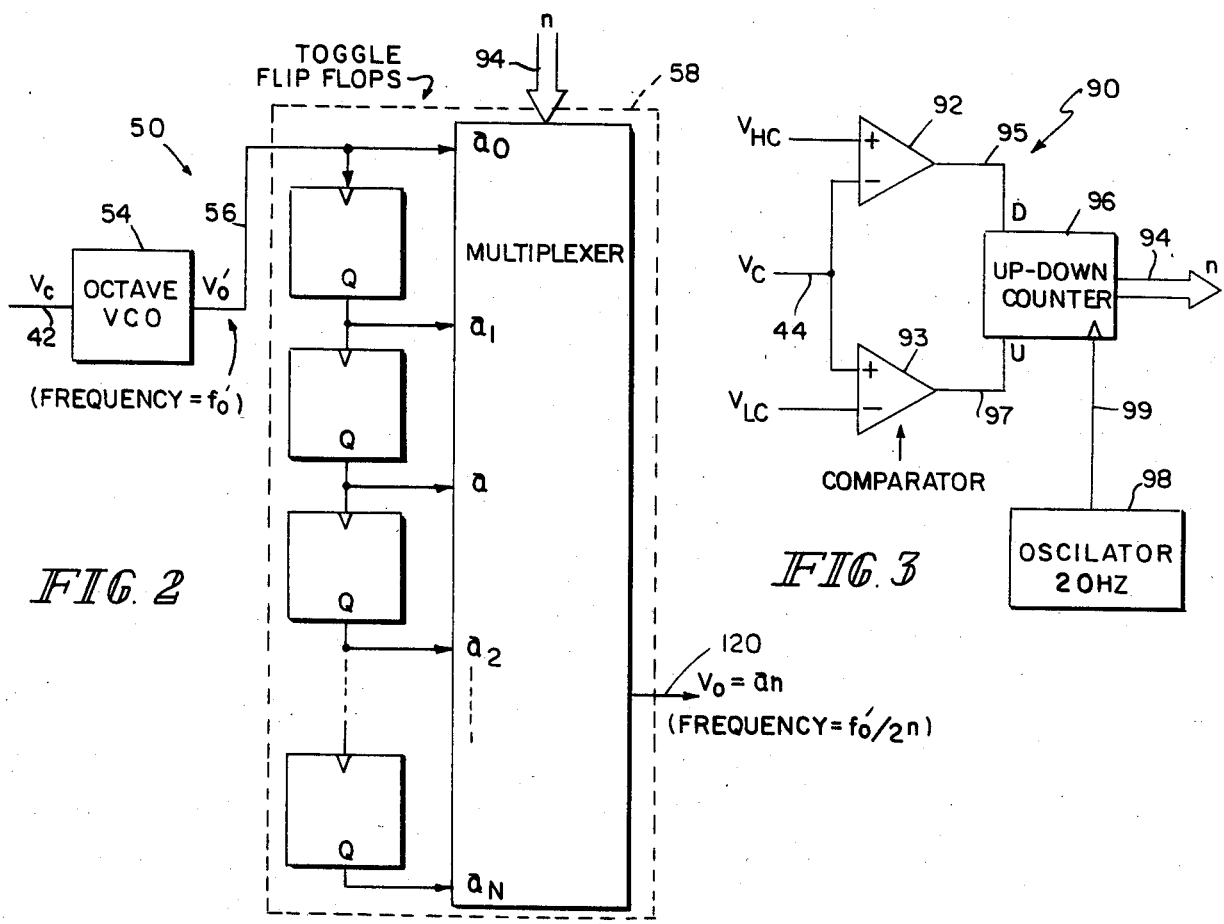
FIG. 2
FIG. 3

WIDE RANGE CLOCK RECOVERY CIRCUIT

BACKGROUND AND SUMMARY OF THE INVENTION

The present invention relates generally to data clock recovery circuits and, more particularly, to such circuits for recovering clock over a wide frequency of NRZ data.

For a communications link to receive data, it must first recover the clock rate at which the data is arriving. Typically, the incoming digital data format may be of the non return to zero (NRZ) type. NRZ digital data generally refers to a binary code form having two states, "zero" and "one", with no neutral state: information may be contained in the state of the waveform. When NRZ data formats are used there may be very little clock signal energy in the data signal and, thus, a phase lock loop (PLL) circuit may often be necessary to recover the data. If the data rate of the incoming signal can vary only by about ±1%, the PLL can usually acquire lock by itself. If the data rate can vary by as much as ±30%, a frequency comparator coupled with the PLL may be necessary to acquire lock. However, if the data rate is random or varies by significantly more than this, say, for example, by a ratio of 350 to 1, then frequency comparator-PLL devices are no longer sufficient because, for example, there are inherent ambiguities between data rates that are multiples of each other. For example, such devices cannot determine the difference between a 1010 data code at a 1 MHz frequency and a 11001100 data code at a 2 MHz frequency. In such circumstances, it becomes necessary to provide additional information to the clock recovery circuit in order to acquire lock.

Typically, prior data transmission systems have had to operate at a single clock rate or at a limited number (perhaps seven or eight) of standard clock rates due to the difficulty of recovering clock signals from data signals which vary over a wide range of frequencies. In this case, additional information in the form of a specifically defined selection of data rates may be provided by switch-selected inductors or crystals to enable clock recovery. Unfortunately, if the number of possible data frequencies becomes large, the number of necessary inductors or crystals would render the circuit impractical.

The present invention solves this problem by creating a continuously variable crystal, in the form of a frequency synthesizer. Prior wide range frequency synthesizers have often required direct frequency synthesis or multi-loop realization, both of which involve much signal mixing and filtering and would further complicate the clock recovery circuit. Attempts to provide clock recovery circuits with single loop realization of a wide range frequency synthesizer have run into serious stability problems, especially in transferring control between loop elements. Employing both a frequency synthesizer and data input recovery means, for example, on a single loop may increase the gain excessively. A narrow PLL bandwidth is desirable to decrease loop gain and may further serve to prevent jitter, but the tradeoff is that lock acquisition time increases as the bandwidth narrows.

Some prior patents have addressed, at least partially, the problem of clock recovery from random data input over a wide range of data frequencies. U.S. Pat. No. 4,375,693 to Kuhn employs a second order PLL having auto-ranging capability, but does not include a frequency synthesizer and, thus, provides only a coarse frequency acquisition (within one half octave). To compensate for this, the Kuhn PLL has a wider bandwidth and acquisition range, but that is often an undesirable feature, especially in high frequency environments and where jitter becomes excessive. The Kuhn device is also restricted in its recoverable clock frequencies because the phase comparator includes frequency division by 32.

U.S. Pat. No. 3,959,601 to Olevsky is specifically discussed and distinguished in the Kuhn Patent on the basis of its frequency synthesizer means to modulate the data signal to higher frequencies. The range of recoverable frequencies is comparatively limited. The specification contemplates operation only up to 12.95 MHz and the presence of up counter 14 effectively limits the top frequency to only 100 MHz. Further, the frequency synthesizer does not share a common VCO with a clock recovery PLL.

Other patents, such as U.S. Pat. No. 4,215,245 to Bellisio, are addressed to entirely different problems, but include in their circuitry an auto-ranging wide range VCO means. However, none of these references are known to suggest the use of such a VCO means shared between a frequency synthesizer and a clock recovery PLL.

Further, in many data communications systems, it is particularly desirable to have as wide and high a frequency range of recoverable clock signals as possible. Unfortunately, in many current commercially available VCO's there is a tradeoff between the VCO tunable range and the maximum frequency which can be produced. For example, VCO's having a top frequency of 50 MHz may typically have a tunable range of 45 MHz, down to 5 MHz. However, VCO's having a top frequency of 250 MHz are usually only tunable down to 125 MHz. Thus, as the top frequency increases, the ratio of the top to bottom frequencies decreases. This tradeoff often requires at least extremely complex circuitry having, for example, signal mixing and filtering to achieve a clock recovery range for high top frequency systems also having an extended range.

It is therefore an object of the present invention to provide a means for clock signal recovery from variable rate data streams over a wide range of frequencies.

Another object of the present invention is the provision of a clock recovery circuit operable at high frequencies and having a short lock acquisition time.

A further object of the present invention is to provide clock recovery from non return to zero input data over a large range of data rates.

A still further object is the provision of a clock recovery means wherein system stability is maintained in a smooth transfer of VCO control between a wide range frequency synthesizer means and a clock recovery PLL.

Yet another object is to provide a wide range clock recovery circuit having PLL means and frequency synthesizer means for programming the VCO of that PLL means and with single loop realization without mixing and filtering.

Yet still another object is the provision of a clock recovery circuit tunable over a wide frequency range and at high frequencies wherein the PLL bandwidth may be very narrow and yet provide short acquisition time by inputting an initial estimate of the clock frequency.

These and other objects of the present invention are attained in the provision of a clock signal recovery circuit for digital data communications having data input means, phase lock loop (PLL) clock recovery means, and wide range frequency synthesizer means. The PLL means and frequency synthesizer means share control of a single wide range VCO means which includes a narrow range VCO with frequency divider means and auto-ranging means for permitting single loop realization. Coarse tuning of the data rate may be achieved by user programming of an approximate data frequency value into the wide range frequency synthesizer loop which initially controls the VCO output frequency. Fine tuning is achieved by the PLL directly when the frequency synthesizer brings the difference between the wide range VCO frequency and the actual data rate to within the PLL bandwidth. Frequency synthesizer control of the wide range VCO is disabled during fine tuning.

The present invention permits the utilization of a narrow bandwidth PLL in a wide range clock recovery circuit. Thus, the PLL means can reduce jitter and provide better overall circuit stability in high frequency applications. In order to maintain short acquisition time in wide range applications, a frequency synthesizer means is provided for initially controlling the VCO means also utilized by the PLL means. The frequency synthesizer means responds to user input signals which represent estimates of the input data rate to control the output frequency of the shared VCO means. If this frequency estimate is accurate to within the seizure bandwidth of the PLL means, when the frequency synthesizer means causes the VCO means to reach that estimated frequency the PLL means seizes control of the VCO means for fine tuning of that estimated frequency and disables control by the frequency synthesizer means.

To permit single loop realization of such a wide range clock recovery circuit at high frequencies, a wide range VCO means is provided having an auto-ranging means. The narrow range VCO means may provide the highest frequency "window" or range of tunable frequencies. If, for example, the input data rate or the frequency synthesizer means' estimate of that data rate is less than any frequency in that window, then the auto-ranging means divides down the narrow range VCO frequency by some predetermined factor so as to create a lower frequency window and then checks to see if the estimated or input data rate is within this range. When the appropriate frequency range is found, the VCO means is tuned to output the estimated frequency.

Other objects, advantages, and novel features of the present invention will become apparent when considering the following detailed description of the preferred embodiment in conjunction with the drawings.

BRIEF DESCRIPTION OF THE DRAWINGS

FIG. 1 shows, in block diagram form, a wide range clock recovery circuit according to the present invention.

FIG. 2 shows, in block diagram form, a wide range VCO suitable for use in the embodiment of the present invention shown in FIG. 1.

FIG. 3 shows, in block diagram form, a range selector suitable for use in conjunction with the VCO shown in FIG. 2 in the embodiment of the present invention shown in FIG. 1.

DESCRIPTION OF THE PREFERRED EMBODIMENT

Figure 4:
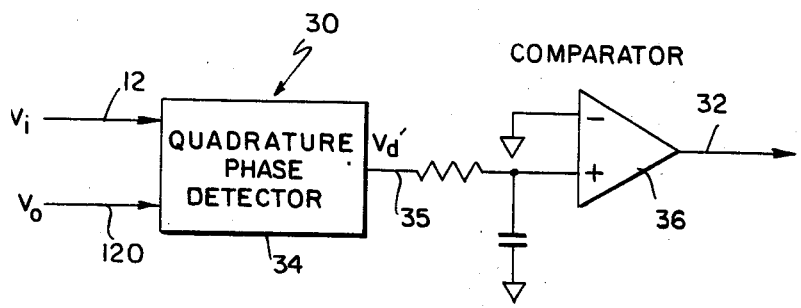
FIG. 4 shows, in block diagram form, a lock detector suitable for use in the PLL means of the embodiment of the present invention shown in FIG. 1.

FIG. 1, which illustrates a preferred embodiment of the present invention, shows a block diagram of a wide range clock recovery circuit 100 having data input means, clock recovery phase lock loop (PLL) means, and wide range frequency synthesizer means. The data input means includes a programmable monostable signal processing means 10. The PLL means includes phase detector means 20, lock detector means 30, loop filter means 40, and wide range voltage controlled oscillator (VCO) means 50. The wide range frequency synthesizer means includes reference signal oscillator means 60, frequency divider means 70, frequency detector means 80, loop filter means 40, wide range VCO means 50, and range selector means 90.

As seen in FIG. 1, according to the present invention the PLL means and frequency synthesizer means share the control of and receive the same output signals from wide range VCO means 50 from summing junction 110 and VCO output line 120, respectively. The function of the frequency synthesizer means in this arrangement is to provide a fast, coarse approximation of the input data rate at a given time. The frequency synthesizer means causes loop filter 40 to bring the output frequency $f_o$ of wide range VCO means 50 to approximately the input data frequency level, within the seize bandwidth of the PLL means. The PLL means may then control VCO means 50 to fine tune output frequency $f_o$ to achieve lock. By using the frequency synthesizer means to initially adjust frequency $f_o$ of VCO means 50, the PLL means may only need a narrow bandwidth and, thus, acquisition time may be significantly decreased.

Frequency detector means 80 receives input signals $V_r$ and $V_2$ from reference signal oscillator means 60 along line 62 and frequency divider means 70 along line 72, respectively, and compares reference frequency $f_r$ of signal $V_r$ with frequency $f_2$ of signal $V_2$. Frequency detector means 80 outputs a difference indicative signal of voltage $V_f$ along line 82 to loop filter 40, which, through voltage level-type control signal $V_c$, causes VCO 50 to alter its output signal $V_o$ (having a frequency $f_o$), which is inputted to frequency divider means 70 along line 120, such that $f_2$ approaches $f_r$. Frequency divider means 70 outputs $f_2$ by dividing frequency $f_o$ of output signal $V_o$ by an integer factor m. Although not essential to the present invention, it has been found to be particularly advantageous to provide frequency divider 70 with user programmability with regard to factor m. By varying m, the user can selectively synthesize frequency $f_o$.

The resolution of the frequency synthesizer means is determined by $f_r$, and the percentage of such resolution is $f_r/f_o = 1/m$. Thus, the worst case resolution is at the lowest frequency and lowest value of m. In order to be able to select $f_o$ to be within ±1% of any frequency in the given range for the example above, the worst case m or minimum m should be at least 50. If a conservative estimate is desired, that value of m may be selected to be 100. Therefore, if, for example, the desired range of $f_o$ is between 1 MHz and 350 MHz, the range of m is between 100 and 35,000, and $f_r$ is 10 KHz. If $f_r$ is to be 1 MHz or greater, reference signal oscillator means 60 may, for example, include crystal oscillator means to generate this frequency. If $f_r$ is to be less than 1 MHz, then crystal oscillator means may, for example, be followed by another frequency divider means to achieve the desired frequency.

The necessary output frequency range of VCO means 50 is thus determined by the range of m values possible with the frequency synthesizer means. If the range of possible m values is defined between $M_1$ and $M_2$, where $M_1$ is the minimum M value and $M_2$ is the maximum M value, then the range of $f_o$ should be between $M_1 f_r$ and $M_2 f_r$. VCO means 50 must then be tunable over this range from $M_1$ to $M_2$. As mentioned above in the Background of the Invention, many commercially available VCO means are not able to provide a large tunable range as well as a high maximum frequency and, thus, are not suitable for use in wide range clock recovery circuits. If we consider the tunable range of the VCO means to be a function of $M_2/M_1$, then for typical 50 MHz (maximum) VCO means $M_2/M_1 = 10/1$ and for typical 250 MHz (maximum) VCO means $M_2/M_1 = 2/1$. In a digital communications system employing the present invention, a tunable range of 1 MHz to 350 MHz ($M_2/M_1 = 350/1$) is achievable by means of wide range VCO means 50.

Wide range VCO means 50 may, for example, accomplish this by providing a highest frequency "window" or range of tunable frequencies provided directly by a commercially available, narrow range, high frequency VCO means. If the frequency synthesizer estimated data rate, $mf_r$, is not within this highest range, then a range selecting means may be provided to divide down the output frequencies of the narrow range VCO means by, for example, an integer factor to create a lower range of frequencies. $mf_r$ may then be tested to determine if it lies within this lower range. If not, further lower ranges may be created; if yes, then loop filter means 40 causes VCO means 50 to be tuned to output this estimated frequency.

FIG. 2 illustrates, in block diagram form, a wide range VCO means 50 suitable for use in the present invention which includes at least a narrow range VCO means 54 and an integrated multiplexer means 58. Narrow range VCO means 54 receives control signals of voltage $V_c$ from loop filter means 40 along line 42 and produces an output signal $V_o'$ having frequency $f_o'$ to multiplexer means 58 along line 56. VCO means 54 may, for example, have only a single octave range. Multiplexer means 58 selects the proper frequency division of $f_o'$ under control of signals from n bus means 94 to produce the wide range VCO output $V_o$ having a frequency of $f_o$.

Narrow range VCO means 54 in combination with multiplexer means 58 provides the capability of continuous tuning over a broad range. VCO means 54 may be provided with a high maximum operating frequency of, for example, 350 MHz. While the tuning range of VCO means 54 alone is thus typically only 175 MHz to 350 MHz ($M_2/M_1 = 2/1$), lower frequency tuning may be obtained by frequency dividing this "top octave" of $f_o'$ frequencies by a factor of, for example, $2^n$, where n is an integer and is selected so that $f_o$ is within the desired octave. The range of possible n values is defined between zero and N, and thus $f_o$ is defined between $f_o'/2^N$ and $f_o'$.

To determine the optimum N for a given high frequency embodiment, the following equation may be employed:

$$N \geq \log_2(M_2/M_1) - 1.$$

Therefore, in the above example, where $M_2/M_1 = 350$, N should optimumly be at least equal to eight.

Values of n define particular frequency windows of VCO tunability. If the value of n is changed, the frequency range of VCO means 50 also changes. If m values input to the frequency synthesizer means causes loop filter means 40 to attempt to alter $f_o$ to a frequency level which is not within the given range of VCO means 50 for a particular n value, then the value of n may be changed such that $mf_r$ is within a different n defined frequency range of VCO means 50.

Since frequency divider means 70 is programmable, if the user inputs m as a binary number, simple combinatorial logic means may be provided to determine n from m. However, it is typically more convenient to input m as a binary coded decimal (BCD). In this case, the necessary combinatorial logic becomes very complex. An easier solution would be to include microprocessor means to determine the proper n. If the clock recovery circuit does not also include an accessible microprocessor for other purposes, it may be less expensive to employ an auto-ranging circuit to select the proper n value.

FIG. 3 illustrates, in block diagram form, such a range selector means 90 suitable for use in the present invention which includes at least comparator means 92 and 93, up-down counter means 96, and oscillator means 98. Comparator means 92 and 93 each receive control signals $V_c$ from loop filter means 40 along line 44 as input signals. Further, comparator means 92 receives signals $V_{HC}$ as another input and comparator means 93 receives signals $V_{LC}$ as another input, as $V_{HC}$ and $V_{LC}$ are defined hereinbelow. The output signals from comparator means 92 and 93 in response to comparison of the magnitudes of their respective input signals are applied to the down and up terminals of up-down counter means 96 along input lines 95 and 97, respectively, Oscillator means 98 applies a clock signal to counter means 96 which may, for example, be 20 Hz, along line 99. The output from counter means 96 is applied to n bus 94 to define the frequency range $f_o$ of the output signal of VCO means 50.

Input signals $V_{HC}$ and $V_{LC}$ are defined as follows. Loop filter means 40 can drive control signal $V_C$ to VCO means 54 between minimum and maximum voltage values of $V_{cmin}$ and $V_{cmax}$, respectively. The value of $V_c$ within this $V_{cmin}$ to $V_{cmax}$ range which would cause VCO means 54 to produce its highest output signal frequency is defined as $V_{HC}$. The value of $V_c$ which would cause VCO means 54 to produce its lowest output signal frequency is defined as $V_{LC}$. As a practical matter, it may often be desirable to provide a slight margin of error and define $V_{HC}$ to be slightly greater than the exact voltage which would produce the maximum $f_o'$. Likewise, it may often be desirable to define $V_{LC}$ to be slightly less than the exact voltage which would produce the minimum $f_o'$. In order for loop filter means 40 to drive VCO means 54 to produce $f_o'$ over the fullest frequency range, the range from $V_{LC}$ to $V_{HC}$ must be included within the range of $V_{cmin}$ to $V_{cmax}$.

Values of n are input into multiplexer means 58 to alter the range of output frequencies $f_o$. If, for a particular starting value of n, $f_o$ is not able to be tuned to reach $mf_r$ for any $V_c$ within the range of $V_{LC}$ to $V_{HC}$, then a different value of n may automatically be selected by range selector means 90. For example, where VCO means 50 cannot produce an $f_o$ high enough to reach $mf_r$, loop filter means 40 will produce a $V_c$ signal greater than $V_{HC}$. When this occurs, comparator means 92 may cause the down input of counter means 96 along line 95 to go low and, thus, the value of n may be decremented. Likewise, where $f_o$ cannot go low enough to reach $mf_r$ for a given n value, $V_c$ will be less than $V_{LC}$ and comparator means 93 will cause the up input of counter means 96 along line 97 to go low and, thus, increment the value of n.

Oscillator means 98 may, for example, be provided with a 20 Hz clock signal. If so, then the frequency synthesizer means will have 50 ms in which to acquire lock if the new value of n input into multiplexer means 58 along n bus 94 causes the tunable range of VCO means 50 to now include $mf_r$. If lock is achieved $V_c$ will now lie between $V_{LC}$ and $V_{HC}$ and counter means 96 will maintain that value of n. If lock is not achieved within this time period $V_c$ will remain outside the range of $V_{LC}$ to $V_{HC}$, and counter means 96 will further increment or decrement, as appropriate, the value of n with every clock signal until lock is acquired or until the range of possible n values is exceeded. Thus, an autoranging circuit is provided for the present invention which will eventually find the proper value for n even without direct knowledge of the m value input by the user.

The combined circuit shown in FIG. 1 is capable of functioning as either a frequency synthesizer means or as a PLL means to lock onto the input data rate. Phase detector means 20 receives input signals $V_i$ from the data input means along line 12 and $V_o$ from VCO means 50 along line 120. Phase detector means 20 outputs voltage-type control signal $V_d$ to loop filter means 40 in response to a phase difference between these input signals.

In general, phase detector means 20 alone will be able to produce a $V_d$ signal which can effectively control VCO means 50 for fine tuning of $f_o$ only where difference between the frequencies of input signals $V_i$ and $V_o$ is small. For large frequency differences the detected phase differences are quickly slewing to the left or right and the average of $V_d$ is almost zero. Since that $V_d$ signal is so small, it cannot effectively control VCO means 50 to acquire lock within a commercially practical acquisition time. $V_c$ may not be precisely zero because the phase difference slewing may cause an asymmetrical beat note signal in the direction that $f_o$ should be tuned to eventually acquire lock. This asymmetrical beat note signal decreases as the frequency difference between $V_i$ and $V_o$ signals increases. Therefore, where the frequency synthesizer means is employed to bring $f_o$ close to the data rate, until the PLL means has seized, the $V_d$ signals to loop filter means 40 are so small in comparison to $V_f$ that they may be virtually ignored in designing and operating clock recovery circuit 100.

If the user input of m has brought $f_o$ to within, for example, ±1% of the input data rate and the seize bandwidth of the PLL means has been selected to also be ±1%, the PLL means will seize, and lock detector means 30 will output an inhibit signal to frequency detector means 80 along line 32 which disables the operation of the frequency synthesizer means portion of the circuit. The voltage necessary to maintain the $f_o$ output of VCO means 50 may then be provided by charged capacitor integrator means within loop filter means 40. Such integrator means are well known to those skilled in the art and will not be detailed herein.

FIG. 4 illustrates, in block diagram form, a lock detector means 30 which is suitable for use in the present invention and which includes quadrature phase detector means 34 and comparator means 36. Quadrature phase detector means 34 receives input signals $V_o$ along line 120 and $V_i$ from the data input means along line 12 and produces signal $V_d'$ in response to the phase difference between these input signals. This $V_d'$ signal is carried along line 35 to comparator means 36. For example, when the phase difference between these input signals is less than $\pi/2$, the PLL has seized and $V_d'$ may, for example, be high, while when that phase difference is otherwise or slewing to the left or right the PLL means has not yet seized and the average $V_d'$ may be zero. The average of $V_d'$ signals is inputted to comparator means 36. When that average is high, indicating that the difference between $f_o$ and the data rate is now within the PLL bandwidth, comparator means 36 outputs the inhibit signal along line 32 to disable control of VCO means 50 by frequency detector means 80. For example, if an MC4044 integrated circuit is employed as frequency detector means 80, its output can be disabled by using two OR gate circuits to keep its two U and D inputs high.

Typically, NRZ input data must first be processed in order for the PLL means to be able to lock onto the clock or data rate, and this processing must change as the data rate changes. Such processing is often needed to make each input data transition correspond to a pulse of a given width so as to generate a baud component. The PLL means gain will depend upon the duty cycle of the pulses produced in response to input data transitions. Commercially available PLL means often operate most effectively at a 50% duty cycle, where the positive pulses equal the negative pulses. With random rate input data it may not be possible to achieve precisely a 50% duty cycle, but this duty cycle can be approximated by generating a half time slot wide pulse for each transition. Some form of pulse width modulation with frequency changes is often required in wide range clock recovery environments. This pulse width may change as the data frequency changes in order to maintain effective operational controls in most commercially practical PLL means. In the clock recovery circuit of the present invention it may be particularly advantageous to permit the pulse width to remain within a given level (±33% of $1/(2f_o)$) for a particular value of n which determines the frequency range of $f_o$.

Figure 5:
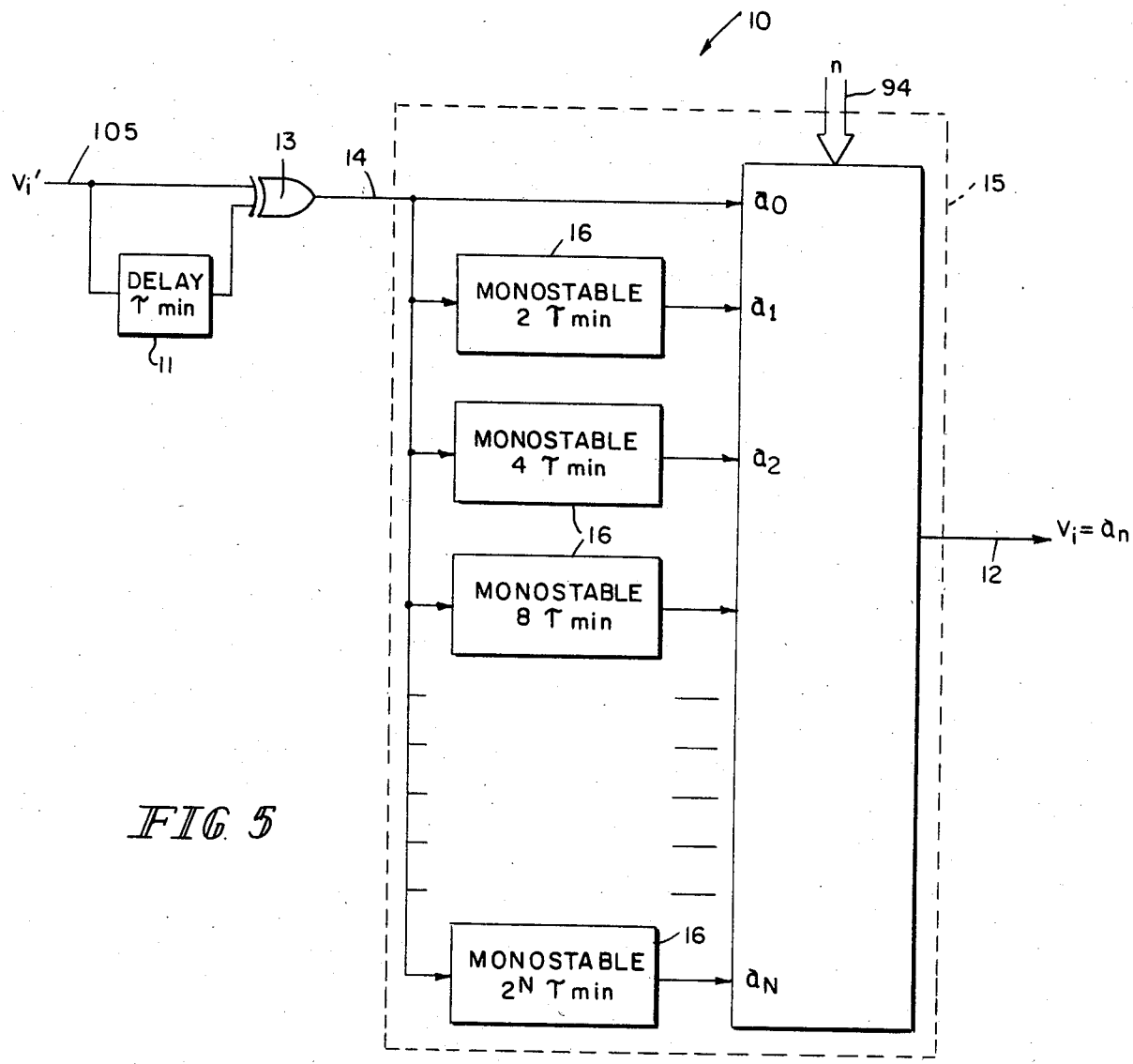
FIG. 5 shows, in block diagram form, a programmable monostable NRZ data processing circuit suitable for use in the embodiment of the present invention shown in FIG. 1.

FIG. 5 illustrates, in block diagram form, a programmable monostable signal processing means 10 suitable for use in the present invention. This processing means 10 produces output data pulses $V_i$ along line 12 in response to each transition of input data pulses $V_i'$ along line 105. Thus, the data rate signals to phase detector means 20 along line 12 may no longer be of NRZ format. Processing means 10 includes at least exclusive OR gate means 13, having $V_i'$ as input signals along input line 105 and $T_{min}$ delay line 11, and multiplexer means 15, receiving as input signals the output of exclusive OR gate means 13 along line 14 and n values from n bus 94.

Multiplexer means 15 may include a series of $2^N T_{min}$ monostable vibrator means 16 providing selectable inputs and produces output signal $V_i$ along line 12.

The circuit of the preferred embodiment of the present invention recovers clock from NRZ data over a wide range of data rates or frequencies. The user may enter a number m to indicate an estimate of the data rate to within a given level of accuracy depending upon the seize range or bandwidth of the PLL means. This required accuracy may advantageously be ±1%, but it could be loosened to other desired values of, for example, ±5%. The low end of the data rate recovery range which can be handled by the present invention is only a function of how many stages are to be added to the various circuits to increase the N value. The high end of the recovery range is a function of phase detector capability with random data at high frequencies. Currently, this rate can even be, for example, 500 MHz when using an ECL exclusive OR gate as a phase detector.

Thus, the present invention provides a circuit for wide range clock recovery suitable at high frequencies and over widely varying data rates. Smooth control transfer without loss of stability is provided between a clock recovery PLL means and a frequency synthesizer means sharing VCO means with a single loop realization despite highly nonlinear and time varying factors. Further, the circuit structure of the present invention enables the PLL means to have a very narrow bandwidth and yet maintain a short acquisition time and high upper frequency. In the examples described hereinabove, for clock recovery over a range of 1 MHz to 350 MHz, PLL bandwidth could be 0.25% of the clock frequency and the acquisition time could be about one second.

While a preferred embodiment of the present invention has been described above in detail, it is to be clearly understood that the spirit and scope of the present invention are not limited to such. Those skilled in the art will recognize that numerous other embodiments are within the spirit and teachings of the present invention. The scope of the present invention is to be limited only by the terms of the following claims.

What is claimed is:

1. A wide frequency range, random variable data rate clock signal recovey circuit for digital data communications receiver comprising:
   data input means for receiving input data signals;
   phase lock loop means connected to said data input means and receiving input signals therefrom for clock signal recovery and including voltage controlled oscillator means for generating output signals and signals utilized within said phase lock loop means and phase detector means having at least a first input from said data input means and a second input from said voltage controlled oscillator means for comparing the phase of said first and second input signals and outputting signals to said voltage controlled oscillator means representative of the difference between said first and second input signals;
   means for generating reference signals distinct from the output of said voltage controlled oscillator means;
   frequency synthesizer means receiving as inputs said reference signals and output signals of said voltage controlled oscillator means and being connected in a loop with said voltage controlled oscillator means of said phase lock loop means for initially controlling said voltage controlled oscillator means to produce signals which estimate the frequencies of said input data signals to a level of accuracy within the seizure bandwidth of said phase lock loop means; and
   lock detector means having at least a first input from said data input means and a second input from said voltage controlled oscillator means for producing a signal to said frequency synthesizer means for disabling the output of said frequency synthesizer means in response to the difference between said first and second input signals to said lock detector means being within said bandwidth of said phase lock loop means.

2. The wide range clock recovery circuit according to claim 1, wherein said level of accuracy is determined by the frequency of said reference signals.

3. The wide range clock recovery circuit according to claim 1, wherein said frequency synthesizer means includes means for receiving user input signals representative of estimates of said input data signal frequencies and controlling the frequency output of said voltage controlled oscillator means in response to said user input signals to produce said estimates of the data signal frequencies.

4. The wide range clock recovery circuit according to claim 1, wherein said voltage-controlled oscillator means includes a narrow range oscillator means for generating output signal frequencies and a frequency divider means connected to said narrow range oscillator means for generating divided signal frequencies from said output signals of said narrow range oscillator means.

5. The wide range clock recovery circuit according to claim 4, wherein said voltage controlled oscillator means further includes range selector means for controlling the dividing factor of said frequency divider means.

6. The wide range clock recovery circuit according to claim 1, wherein said data input means receives non return to zero input data signals.

7. The wide range clock recovery circuit according to claim 6, wherein said data input means includes programmable monostable means for processing said non return to zero input data signals to provide discrete output pulses for each data signal transition.

8. A wide frequency range, random variable data rate clock signal recovery circuit for a digital data communications receiver comprising:
   data input means for receiving input data signals;
   phase lock loop means connected to said data input means and receiving input signals therefrom for clock signal recovery and including voltage controlled oscillator means for generating output signals and signals utilized within said phase lock loop means;
   frequency synthesizer means also including said voltage controlled oscillator means of said phase lock loop means and connected thereto for initially controlling said voltage controlled oscillator means to produce signals which estimate the frequencies of said input data signals to a level of accuracy within the seizure bandwidth of said phase lock loop means; and
   said frequency synthesizer means including reference signal oscillator means for generating reference signal frequencies, wide range voltage controlled oscillator means for generating particular signal frequencies as a function of control input signals, frequency divider means for generating divided signal frequencies from said signal frequencies produced by said wide range voltage controlled oscillator means, frequency detector means for comparing said reference frequencies with said divided signal frequencies and generating output signals representative of the frequency differences therebetween, and the loop filter means for generating said control input signals for said wide range voltage controlled oscillator means in response to said output signals from said frequency detector means.

9. The wide range clock recovery circuit according to claim 8, wherein said frequency synthesizer means provides single loop realization without signal mixing, and wherein said frequency divider means is user programmable to divide the output of said wide-range voltage controlled oscillator means by a user input factor of m, where m is representative of the user estimate of said input data signal frequencies.

10. A wide range signal recovery circuit comprising:
input means for receiving data signals;
voltage controlled oscillator means for generating data approximating signals;
means for generating reference signals;
frequency detector means responsive to said data approximating signals and said reference signals for controlling the output of said voltage controlled oscillator means;
lockout means responsive to said data signals and said data approximating signals for disabling the control of said voltage controlled oscillator means by said frequency detector means when the difference between said data signals and said data approximating signals reaches a predetermined level; and
phase detector means responsive to said data signals and said data approximating signals for controlling the output of said voltage controlled oscillator means when control by said frequency detector means is disabled.

11. A wide frequency range, random variable data rate clock signal recovery circuit for a digital data communications receiver comprising:
data input means for receiving input data signals;
phase lock loop means connected to said data input means and receiving input signals therefrom for clock signal recovery and including voltage controlled oscillator means;
frequency synthesizer means also including said voltage controlled oscillator means of said phase lock loop means and connected thereto for initially controlling said voltage controlled oscillator means to produce signals which estimate frequencies of said input data signals to a level of accuracy within the seizure bandwidth of said phase lock loop means;
said frequencies synthesizer means including reference signal oscillator means for generating reference signal frequencies, wide range voltage controlled oscillator means for generating particular signal frequencies as a function of control input signals, frequency divider means for generating divided signal frequencies from said signal frequencies produced by said wide range voltage controlled oscillator means, frequency detector means for comparing said reference frequencies with said divided signal frequencies and generating output signals representative of the frequency differences therebetween, and loop filter means for generating said control input signals for said wide range voltage controlled oscillator means in response to said output signals from said frequency detector means; and said wide range voltage controlled oscillator means including a narrow range voltage controlled oscillator means for generating signal frequencies, a second frequency divider means coupled to the output of said narrow range voltage controlled oscillator means for generating divided frequencies of said signal frequencies of said narrow range voltage controlled oscillator means, and an autoranging means for controlling the dividing factors of said frequency divider means.

12. A wide frequency range, random variable data rate clock signal recovery circuit for a digital data communications receiver comprising:
data input means for receiving input data signals;
phase lock loop means connected to said data input means and receiving input signals therefrom for clock signal recovery and including voltage controlled oscillator means;
frequency synthesizer means also including said voltage controlled oscillator means of said phase lock loop means and connected thereto for initially controlling said voltage controlled oscillator means to produce signals which estimate frequencies of said input data signals to a level of accuracy within the seizure bandwidth of said phase lock loop means;
said frequencies synthesizer means including reference signal oscillator means for generating reference signal frequencies, wide range voltage controlled oscillator means for generating particular signal frequencies as a function of control input signals, frequency divider means for generating divided signal frequencies from said signal frequencies produced by said wide range voltage controlled oscillator means, frequency detector means for comparing said reference frequencies with said divided signal frequencies and generating output signals representative of the frequency differences therebetween, and loop filter means for generating said control input signals for said wide range voltage controlled oscillator means in response to said output signals from said frequency detector means; and
said phase lock loop means including phase detector means having at least a first input from said data input means and a second input from said voltage controlled oscillator means for comparing the phase of said first and second input signals and outputting signals to said loop filter means representative of the difference between said first and second input signals, and lock detector means having at least a first input from said data input means and a second input from said voltage controlled oscillator means for producing a signal to said frequency detector for disabling the output of said frequency detector in response to the difference between said first and second input signals to said lock detector means being within said bandwith of said phase lock loop means.

* * * * *